(12) United States Patent
Bernstein et al.

(10) Patent No.: US 6,548,338 B2
(45) Date of Patent: Apr. 15, 2003

(54) INTEGRATED HIGH-PERFORMANCE DECOUPLING CAPACITOR AND HEAT SINK

(75) Inventors: Kerry Bernstein, Underhill, VT (US); Robert M. Geffken, Burlington, VT (US); Wilbur D. Pricer, Charlotte, VT (US); Anthony K. Stamper, Williston, VT (US); Steven H. Voldman, South Burlington, VT (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/764,504

(22) Filed: Jan. 17, 2001

(65) Prior Publication Data

US 2001/0050408 A1 Dec. 13, 2001

Related U.S. Application Data

(62) Division of application No. 09/283,828, filed on Mar. 31, 1999, now Pat. No. 6,236,103.

(51) Int. Cl.[7] ............................................ H01L 21/8238
(52) U.S. Cl. ....................... 438/210; 257/516; 257/347; 257/706
(58) Field of Search ................................ 257/516, 532, 257/520, 502, 503, 508, 307, 309; 438/120, 122, 125

(56) References Cited

U.S. PATENT DOCUMENTS 3,962,762 A 6/1976 Kendall et al. ................ 357/14
5,773,362 A 6/1998 Tonti et al. .................. 438/665
5,811,868 A 9/1998 Bertin .......................... 257/516

Primary Examiner—Long Pham
Assistant Examiner—Nathan W. Ha
(74) Attorney, Agent, or Firm—Francis J. Thornton; Richard M. Kotulak

(57) ABSTRACT

A significant and very effective decoupling capacitor and heat sink combination that, in a single structure provides both a heat sink and a decoupling capacitor in close proximity to the active circuit on the chip requiring either heat sinking or decoupling capacitance or both. This is achieved by forming on a semiconductor chip, having a buried oxide layer therein, an integrated high-performance decoupling capacitor that uses a metallic deposit greater than 30 microns thick formed on the back surface of the chip and electrically connected to the active chip circuit to result in a significant and very effective decoupling capacitor and heat sink in close proximity to the active circuit on the chip requiring such decoupling capacitance and heat sinking capabilities. The decoupling capacitance can use the substrate of the chip itself as one of the capacitive plates and a formed metallic deposit as the second capacitive plate which also serves as a heat sink for the active circuit formed in the chip. The structure thus provides both a significant and effective decoupling capacitance in close proximity to the active circuit on the chip requiring such decoupling capacitance as well as providing improved heat sinking for the decoupled active circuit.

7 Claims, 4 Drawing Sheets

INTEGRATED HIGH-PERFORMANCE DECOUPLING CAPACITOR AND HEAT SINK

This application is a division of application Ser. No. 09/283,828, filed Mar. 31, 1999 now U.S. Pat. No. 6,236,103.

FIELD OF THE INVENTION

This invention relates generally to semiconductor circuit devices utilizing decoupling capacitors and heat sinks and more particularly to a semiconductor chip having a circuit formed on its active front major surface and having an integral decoupling capacitor and heat sink formed on the inactive back major surface of the chip. Thus, the invention teaches a significant and very effective decoupling capacitor and heat sink combination that, in a single structure provides both a heat sink and a decoupling capacitor in close proximity to the active circuit on the chip requiring either heat sinking or decoupling capacitance or both.

BACKGROUND OF THE INVENTION

As integrated circuits on semiconductor chips became denser, faster and more complex, their electrical performance requirements became higher and the need for greater heat sink capacity became greater. Consequently these integrated circuits required both greater and more effective capacitive decoupling and improved heat sink capacity.

Effective capacitive decoupling in integrated circuits has, in the past, been provided by several different methods. One approach added discrete decoupling capacitors onto the package containing the integrated semiconductor chip. Another approach added the capacitor in available regions in the circuitry itself. The latest approach utilizes the substrate of the chip itself as a capacitive plate with the other plate being comprised of an insulatively coated metallic deposit formed on the back or inactive major surface of the chip.

Each of these approaches has drawbacks. In the first, because the decoupling capacitor is quite remote from the active circuitry on the chip, they provide, at best, only marginal decoupling and no known heat sink capability.

In the second, as the circuitry, on the chip, became denser, the need of larger and better decoupling capacitors that could handle larger on chip voltages or voltage spikes became greater just as the free area into which such capacitors could be placed became reduced. Thus the capacitors became smaller and any heat sinking capacity that they might have provided became similarly reduced.

The latest approach which utilizes the chip substrate as the first plate of the coupling capacitor with the other plate being comprised of an insulatively coated metallic deposit formed on the back or inactive major surface of the chip not only reduced the ability to affix heat sinks onto the chip but the insulation on the surface of the second plate increased the thermal heating effects in the devices on the chip leading to the possibility of reduced electrical performance in the circuitry.

Silicon on insulator (SOI) technology provides enhanced performance by reduction of MOSFET junction capacitance. The power (P) of a semiconductor chip is a function of chip capacitance (C), power supply voltage (V), and the transition frequency (f), i.e., $P=CV^2 f$. While the decrease in chip capacitance is an advantage for power reduction and enhanced chip performance, the decrease in chip capacitance is a concern for noise, electrostatic discharge, (ESD) and stability. Therefore in silicon on insulator (SOI) devices there is a need for extra capacitance to improve total chip capacitance. This is achieved with decoupling capacitors.

SUMMARY OF THE INVENTION

The present invention solves all of these problems by incorporating in a single component on the chip surface both a heat sink and a decoupling capacitor.

This is achieved by creating a decoupling capacitance that uses the substrate of the chip itself as one of the capacitive plates and a formed metallic deposit that serves as both the second capacitive plate and a heat sink for the active circuit formed on the front or active major surface of the chip.

The present invention thus results in a significant and very effective decoupling capacitor and heat sink combination that, in a single structure provides both a heat sink and a decoupling capacitor in close proximity to an active circuit on an integrated circuit device requiring either heat sinking or decoupling capacitance or both.

More specifically the present invention achieves this desirable result by forming a plurality of trenches in the first plate of the capacitor and placing metal deposits in the trenches and selectively and individually connecting, through appropriate vias, these deposits to the circuits, on the front surface of the chip, needing the precise decoupling capacitance and heat sinking capability.

Accordingly the invention provides, in close proximity to an active semiconductor circuit requiring decoupling capacitance and heat sinking, a significant and very effective decoupling capacitor structure that also serves as a heat sink.

These and other objects and features of the present invention will become further apparent from the following description taken in conjunction with the drawings.

DESCRIPTION OF THE PREFERRED EMBODIMENT

Figure 1:
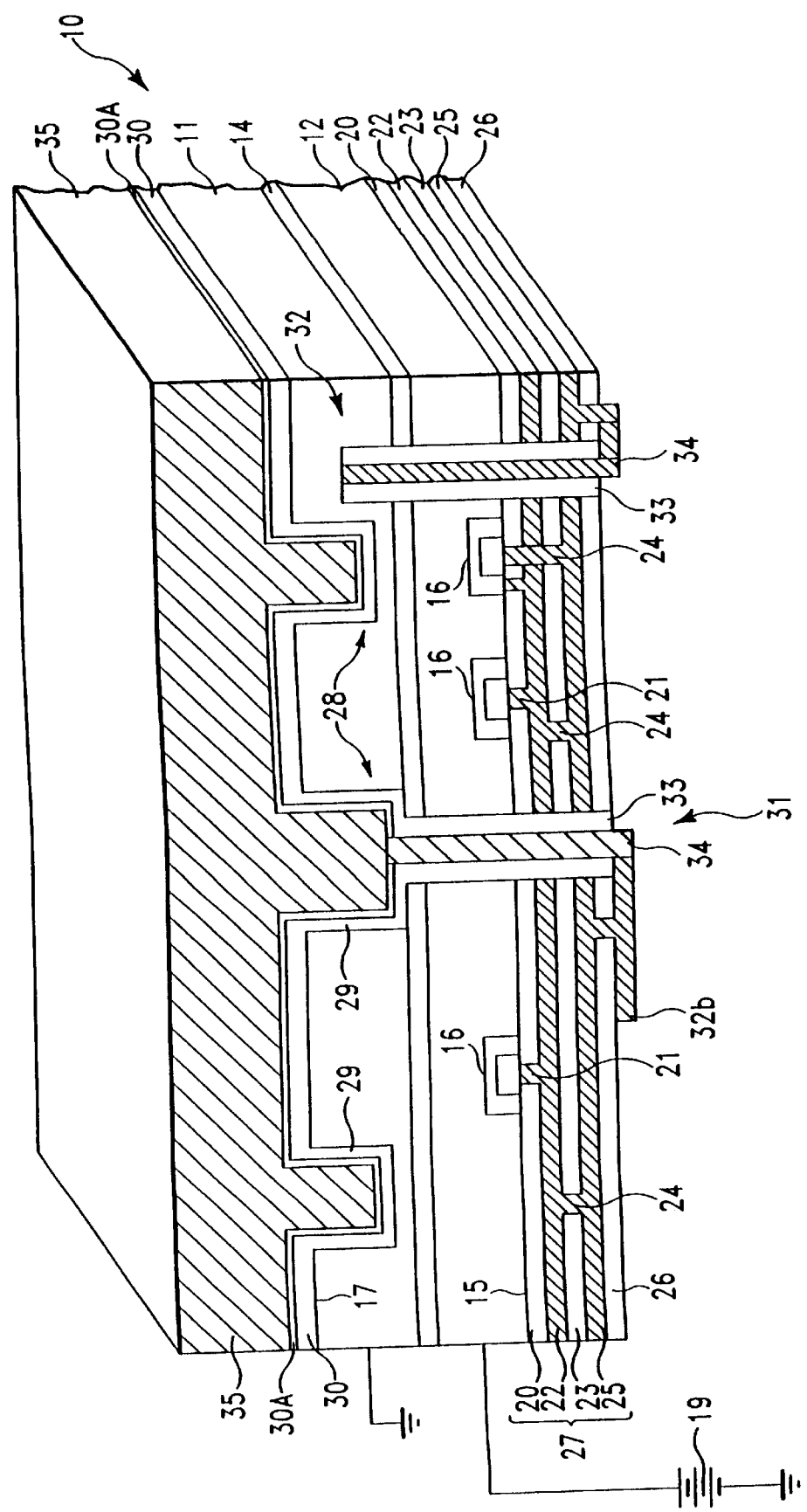
FIG. 1 is a cross-sectional schematic representation of a semiconductor chip having an integrated circuit formed on one face thereof and having a heat sinking decoupling capacitor, in accordance with the present invention, formed thereon which capacitor is coupled to the active circuit devices in the chip to provide both plurality of localized heat sinking and decoupling capacitance.

FIG. 1 is a cross-sectional schematic representation of a silicon on insulator (SOI) semiconductor device 10 employing the present invention.

The semiconductor chip 10 is formed of two layers of semiconductor material a substrate layer 11 and an epitaxial layer 12 separated by a so called buried oxide layer 14. In the epitaxial layer 12, there is formed a plurality of devices 16. The devices 16 can be formed by any means known to the art and typically are formed by diffusion or ion implantation methods both of which are well known to the semiconductor art. The chip 10 thus has a pair of substantially parallel major surfaces 15 and 17 with surface 15 being the active surface or face of the chip and surface 17 the back or inactive surface of the chip.

The devices 16, are used herein to represent both active and inactive circuit elements, e.g., transistors or resistors. To achieve the proper biasing of the devices 16, one or more wiring levels, interposed with insulating or passivating layers, are formed on the surface 15 of the region 12 to interconnect the formed devices 16 into a desired integrated circuit. In present day integrated circuits, the region 12 and the circuit formed of the devices 16 are typically coupled to a selected voltage source 19, usually positive, and the substrate 11 is typically connected to ground. This is possible because of the buried oxide or insulating layer 14 existing, between the regions 11 and 12. This layer 14 typically ranges between 500 Å and 5000 Å. It should be noted that the region 11 could be connected to a second voltage source, either positive or negative, instead of to ground.

More specifically, the desired circuit configuration is created by forming a first insulating layer 20 on the surface 15 and forming interconnection openings 21 therein by etching or the like. A first wiring layer 22 is now formed on the surface of the insulating layer 20 and contacts are made to selected portions of selected ones of the devices 16 through the interconnection openings 21. A second insulating layer of silicon oxide 23 is now formed over the formed wiring layer 22. Following the formation of the insulating layer 23 different interconnection openings 24 are made therein and a second wiring layer 25 is formed on the surface of the insulating layer 23 with the material of the second layer 25 contacting selected portions of the devices 16 as well as selected points on the first wiring layer 22 through the openings 24. A final top passivating layer 26 is disposed over this second wiring level 25. It should be understood that the above steps of forming the insulating layers, the interconnection openings therein and the wiring levels can be repeated any number of times until the final desired circuit is formed. The formation of such multiple wiring levels is widely practiced in the semiconductor art.

Trenches 28 are now formed in the region 11 by any suitable process such as reactive ion etching. The walls 29 of the trenches, are now coated with a suitable, thin, dielectric or insulating layer 30 by any appropriate deposition processes known to the semiconductor art. Preferably this dielectric layer 30, is formed of Silicon Dioxide ($SiO_2$) ranging between 50 and 5000 Ångstoms in thickness. Other suitable dielectrics are Polyamide and Silicon Nitride. Furthermore the layer 30 need not be a single layer of material but can also be made up of multiple layers of suitable materials as will be later discussed in conjunction with FIG. 2. Once the walls 29 are coated with the dielectric layer 30, a thin coating 30A of a refractory material such as tantalum (T), tantalum nitride (TaN), tungsten (W), tungsten nitride (WN), etc. is laid down over the dielectric layer 30 to improve the bonding between the layer 30 and any subsequently deposited materials. Following the deposit of the refractory layer 30A, a coating of conductive material, such as copper, is laid down to form a metallic plate 35 that also serves as a heat sink for the device 10.

Now, precisely positioned vias 31 and 32 are formed in the device. It is to be noted that the via 31 passes through the active layer 12 and the oxide layer 14 and terminates in the substrate 11 while via 32 passes through the regions 11, 12, and 14, and the insulating layer 30 to terminate in the metal layer 35. These vias 31 and 32 may be formed by any number of means such as reactive ion etching or by ablation by applying a laser beam from a XeCl excimer laser to a selected position on the chip 10.

The laser beam, for accomplishing this task, preferably, has a wavelength of 308 nanometers (nm) with a pulse width (FWHM) of 25 nanoseconds (ns). The laser beam is first passed through a commercially available beam homogenizer to develop a uniform intensity profile and then through suitable 10× reducing optics. Beam fluence of 17–30 Joules/$cm^2$ for 20–30 seconds at a pulse rate of approximately 200 pulses per second is particularly suitable for forming the desired via.

The laser beam, striking the chip, ablates all the material thereon, as well as the silicon of the chip itself, and forms a precise, cylindrical hole or via there through. Using the above described laser, the formed via typically has an inner diameter of approximately 0.003 inches and is almost ideally cylindrical in form.

It should be noted that although only two formed vias 31 and 32 are shown in FIG. 1 that a plurality of such vias or holes can be formed in the substrate provided that the vias are separated from the edge or from one another by a distance equal to a least four times the inner diameter of the formed via. Other than these constraints there are no inherent limitations on where these vias can be formed in the chip substrate. However it should be clearly understood that the design of the integrated circuit formed on the active surface 12 can further constrain the location of these vias.

That is, the formed via must be positioned with consideration as to the location of the devices 16, the wiring levels produced on the active face of the chip and any interconnections therebetween.

Once the vias 31 and 32 are formed to their desired depths the walls of the vias are coated with a dielectric coating or layer 33 which extends down the entire length of each via. Preferably the dielectric layers 33 is formed of Silicon Dioxide ($SiO_2$) ranging between 50 and 5000 Ångstoms in thickness. Other suitable dielectrics are Polyamide and Silicon Nitride.

The dielectric layer 33 can be formed using either of the below described low temperature Silicon Dioxide growth techniques.

The first technique consists of the following procedure.

The wafer to be treated is immersed into an aqueous solution of 3650 ml ethanol amine, 1660 ml deionized water, 1150 grams of gallic acid, 0.3 ml of a 10% surfactant solution comprised of potassium fluorinated alkyl carboxalates and sold under the trade name FC-129 by the 3 M Corp. and from 0.006 to 0.5 M of quinoxaline which produces at higher catalyst concentration a suitable dielectric coating, such as silicon dioxide ($SiO_2$), both on the surface 15 of the wafer as well as on the wall of the laser created vias. By controlling the thickness of the oxide, forming layers 33 the core of the via 30 is left open so that a conductive material 34 can be deposited into the vias coated onto dielectric layer 32a coating the via walls.

The second technique is a low temperature deposition of silicon dioxide by a plasma enhanced chemical vapor deposition process. This process uses any commercially available apparatus having a 13.56 MHz RF power source, an electrode spacing of 3.2 cm. and a top electrode maintained at 80° C. This apparatus is capable of depositing $SiO_2$ on a substrate at a rate of approximately 60 Å per minute when the substrate is held temperature of 350° C., the reactive gases, $N_2O$ and $SiH_2$, introduced into the chamber containing the substrate, have a ratio greater than 100, preferably a ratio of approximately 125, with the chamber pressure at 1 Torr and the power level at 25 watts.

Following the formation of the dielectric, an interconnection opening is made through the passivation layer 26 to contact to one of the wiring levels 22 or 25, forming the wiring net 27. A conductive layer 34, formed for example of a metal, such as aluminum, copper, tungsten, gold, lead, tin, silicon or combinations thereof, is now deposited over the dielectric layer 32, and down the length of the via and through appropriate interconnection opening to contact the wiring net on surface 15. Thus the vias connect the capacitive plates, i.e., the substrate 11 and the metal layer 35, to the underlying integrated circuit as required to appropriately decouple the underlying integrated circuit. Furthermore the via coupled 10 the metal layer 35 also serves as a heat sink for appropriate regions of the circuit.

The formation of these metal layers can be made in any number of ways well known to the semiconductor art among which are plating, evaporation or sputtering techniques.

In this way both the substrate 11 and the metallic layer 35 can be connected to respective points in the wiring net 27 requiring capacitive decoupling or heat sinking.

The circuit is completed by forming input/output pads connected to the wiring net and then appropriately securing the finished unit to a suitable semiconductor package.

The SOI device 10 can also be formed by any other number of well-known processes, such as the so-called SIMOX, SIBOND, or SMART-CUT processes.

Figure 2:
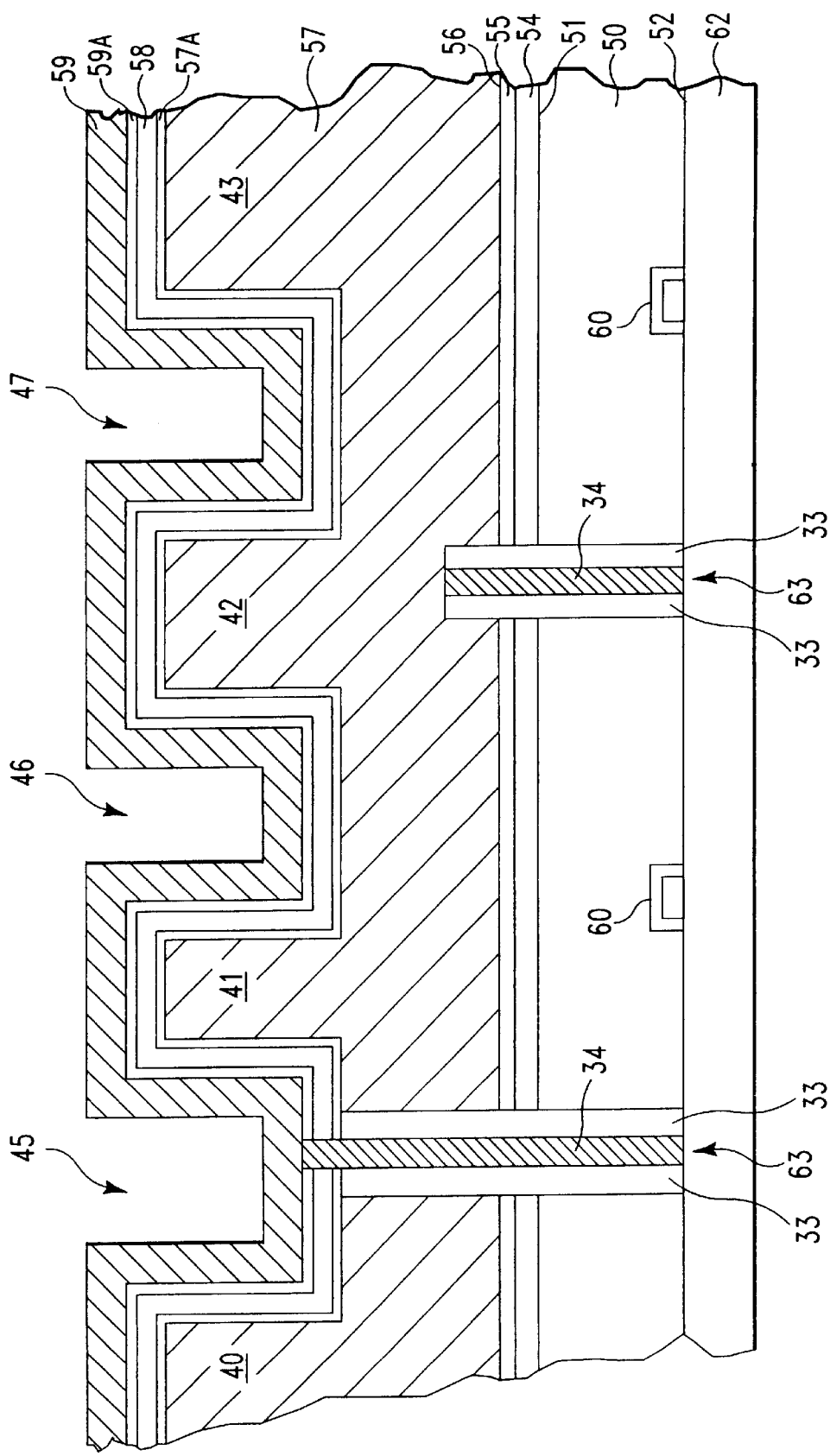
FIG. 2 is a cross-sectional schematic representation of a semiconductor chip having a grooved capacitor plate to provide improved heat sinking.

Turning now to FIG. 2, a different embodiment of the invention will be discussed. FIG. 2 is a cross-sectional schematic representation of a semiconductor chip similar to that of FIG. 1 but having a castellated decoupling capacitor formed on the back of the chip that will further improve the heat sinking capability of the formed capacitor.

Shown in this FIG. 2, the capacitor is provided with a castellated surface that significantly increases both the available capacitance and the heat sinking effects of the structure.

The device shown in FIG. 2 can be manufactured as follows. A suitably doped semiconductor chip 50 that has a pair of substantially parallel major surfaces 51 and 52 has one surface say surface 51 coated with a silicon dioxide layer 54. Over the layer 54 a thin layer, approximately 50 Å, of tantalum nitride (TaN) 55 is now laid down by any one of a number suitable deposition processes known to the semiconductor art. Over this layer of tantalum nitride, there is laid down a thin, i.e., less than 1000 Å in thickness, layer of tantalum 56. A thick, i.e., greater than 20 microns, deposit of a conductive metal 57, such as copper, is coated over the tantalum layer 56. The structure is now subjected to a reactive ion etching process and a plurality of grooves 45, 46, and 47, separated one from the other by a multiplicity of fins 40, 41, 42, and 43, are created in the deposit of conductive metal 57. It should be understood that each of the fins 40, 41, 42 and 43 can be either identical in size or different in size. A layer 57A of a refractory material is now formed over the deposit of conductive material 57. A thin dielectric or insulator 58, i.e., less than 1000 Å in thickness, is now laid down in the grooves 45, 46, and 47 and over the formed fins 40, 41, 42 and 43. Over this thin insulator 58, a second layer 59A of refractory material is deposited. This layer 59a is now coated with a second deposit, i.e., a deposit greater than 20 microns, of a conductive metal 59 such as copper.

At this time, a plurality of active and inactive devices 60 are formed in surface 52 and a wiring complex 62 comprising one or more wiring levels, interposed with insulating or passivating layers, is created thereon to interconnect the formed devices 60 into a desired integrated circuit.

Again selected vias 63 are created in the device, as above described, to interconnect selected wiring levels to either the first or second deposited conductive layers as described previously.

Again the circuit is completed by forming input/output pads (not shown) connected to the wiring net so that the finished unit may be incorporated into a suitable semiconductor package (not shown).

It should be noted that the dielectric layer 58 interposed between the capacitive plates 57 and 58, as shown in FIG. 2, can be formed of a plurality of layers. One such suitable configuration is a tantalum-oxide-tantalum layer. Additionally the vias can be backfilled with any conductive metal such as copper, silver, aluminum, polysilicon, etc.

From the above it can be readily seen that because of the extended surface of the plates 57 and 59 the present invention provides a capacitor having not only greater capacitance than that of the prior art devices but also provides a significant heat sinking capacity than that was not available to prior art devices which depended on placing the decoupling capacitors on the active surface of the circuit.

The formation of the fins 40, 41, 42 and 43 especially improves the heat sinking effect of the plates not only by creating additional surface area for convection cooling and also by provide channels through which air may be forced to enhance air cooling of the unit.

Figure 3:
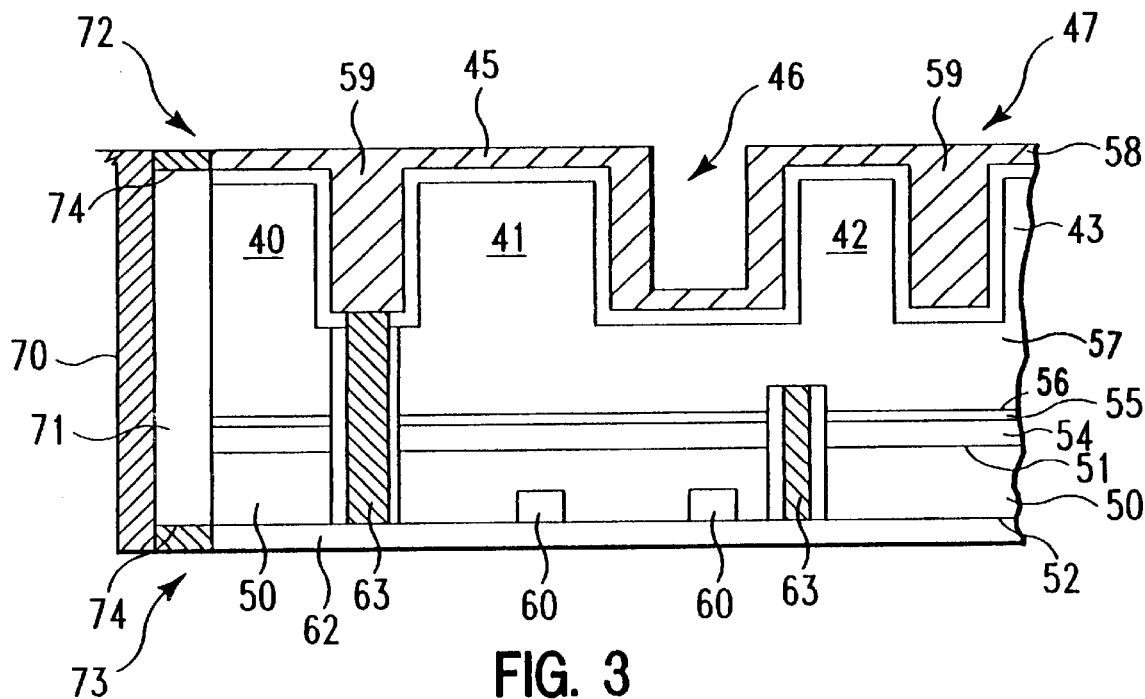
FIG. 3 is a cross-sectional schematic representation of another embodiment of a semiconductor chip having a heat sinking decoupling capacitor coupled to the integrated circuit on the active face by an alternate conductive means.

FIG. 3 is a cross-sectional schematic representation of another embodiment of a semiconductor chip having a heat sinking decoupling capacitor coupled to the integrated circuit on the active face by an alternate conductive means.

The device shown in FIG. 3 can be manufactured as follows. Again a suitably doped semiconductor chip 50 that has a pair of substantially parallel major surfaces 51 and 52 is coated on one surface say surface 51 with a silicon dioxide layer 54. Over the layer 54 a thin layer, approximately 50 Å, of tantalum nitride (TaN) 55 is now laid down by any one of a number suitable deposition processes known to the semiconductor art. Over this layer of tantalum nitride is there is laid down a thin, i.e., less than 1000 Å in thickness, layer of tantalum 56. A thick, i.e., greater than 20 microns, deposit of a conductive metal 57, such as copper, is coated over the tantalum layer 56. The structure is now subjected to a reactive ion etching process and the plurality of grooves 45, 46, and 47, separated one from the other by a multiplicity of fins 40, 41, 42, and 43, are created in the deposit of conductive metal 57. Again it should be understood that each of the fins 40, 41, 42 and 43 can be either identical in size or different in size. A thin dielectric or insulator 58, i.e., less than 1000 Å in thickness, is again laid down in the grooves 45, 46, and 47 and over the fins 40, 41, 42 and 43 formed in the deposit of conductive metal 57. Over this thin insulator 58 a second deposit, i.e., a deposit greater than 20 microns, of a conductive metal 59 such as copper is created.

At this time, a plurality of active and inactive devices 60 are formed at surface 52 and a wiring complex 62 comprising one or more wiring levels, interposed with insulating or passivating layers, is created thereon to interconnect the formed devices 60 into a desired integrated circuit. If desired, selected insulated vias 63, as above described in conjunction with FIG. 2, can also be provided in the device to interconnect selected wiring levels in the wiring complex 62 or devices in the integrated circuit to either or both of the capacitive plates 57 and 59.

A new wiring complex or net 70, formed of one or more alternate conductive paths, can be provided down the sides of the device to interconnect the capacitive plates 57 and 59 to the wiring complex 62.

This net 70 can be created as described above or can be created as follows. An oxide layer 71 is deposited on the sides of device extending from the upper surface of the upper plate 59 to the wiring complex 62 by any suitable method such as described above. Selected openings 72 and 73 are made in this oxide layer 71 and backfilled with a conductive material 74. Now a layer 75 of conductive material is deposited over the entire surface of oxide layer 71. In addition to the conductive materials described above conductive paint can also be used as the layer 75 as well as the material 74 backfilling the openings 72 and 73. This layer 75 contacts the conductive material 74 in the backfilled openings 72 and 73 thereby providing a continuous path in the openings 72 and 73. By creating numerous openings in the oxide layer 71 and backfilling them, as above described and by defining the conductive layer 75 into a plurality of conductive paths contact between the plates 57 and 59, forming the capacitor, may be made to different ones of devices 60 via the wiring complex 62.

Figure 4:
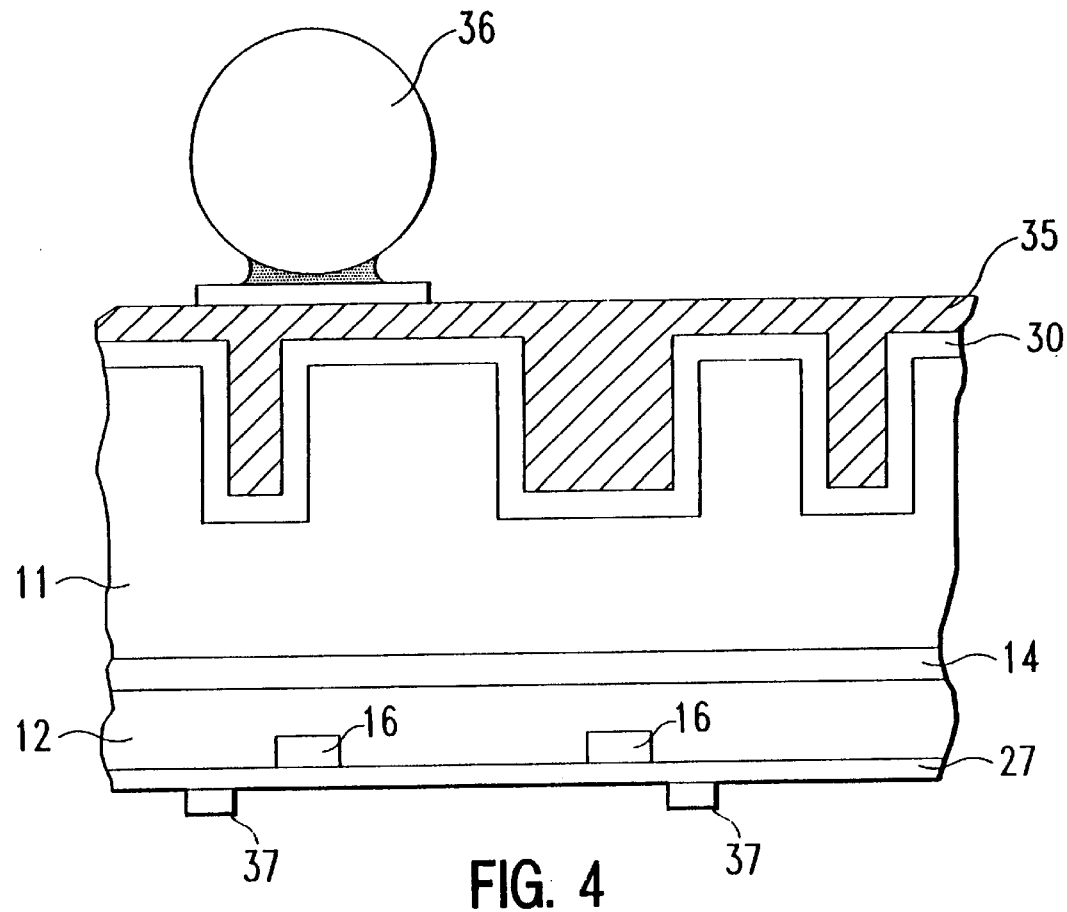
FIG. 4 is a cross-sectional schematic representation of another embodiment of the semiconductor chip of FIG. 1 having a different decoupling capacitor configuration.

Turning now to FIG. 4, there is shown a device substantially identical to the device of FIG. 1. Now however there is provided a means such as a so called C4 connector 36 for coupling the plate 35 to a suitable voltage points (not shown). Also input/output pads 37, well known to the art, can be connected to the wiring complex net 27 so that the finished unit may be incorporated into a suitable semiconductor package (not shown).

Figure 5:
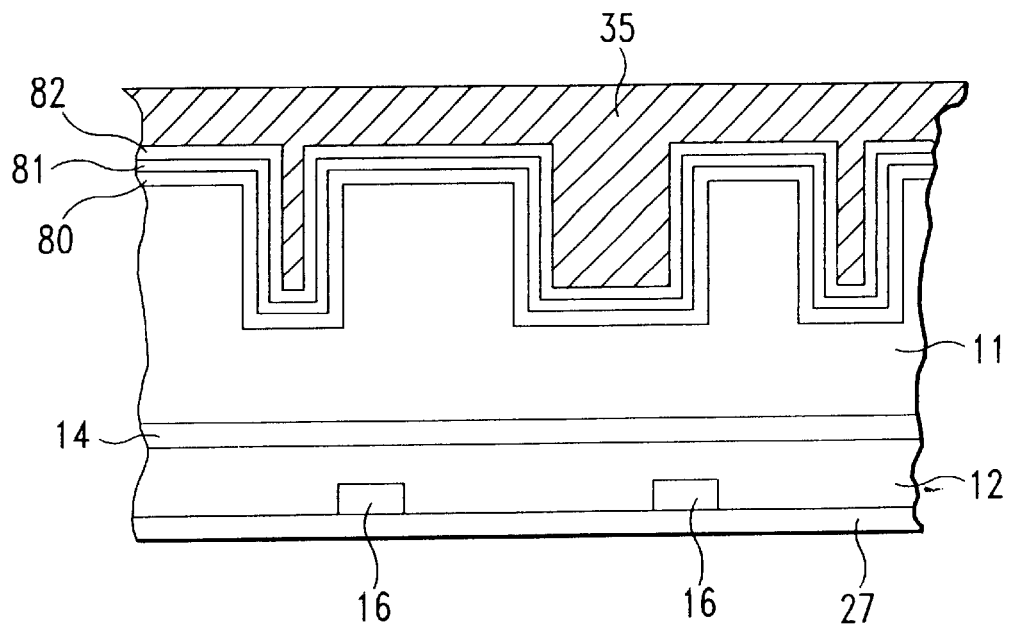
FIG. 5 is a cross-sectional schematic representation of still another embodiment of the semiconductor chip of FIG. 1.

Turning now to FIG. 5, there is shown a device substantially identical to the device of FIG. 1. Now however it should be noted that the dielectric layer 30 interposed between the capacitive plates 11 and 35 is formed of a plurality of layers 80, 81 and 82. One such suitable configuration is where layers 80 and 82 are formed of tantalum and layer 81 is formed of tantalum oxide and is sandwiched between the tantalum layers 80 and 82.

Figure 6:
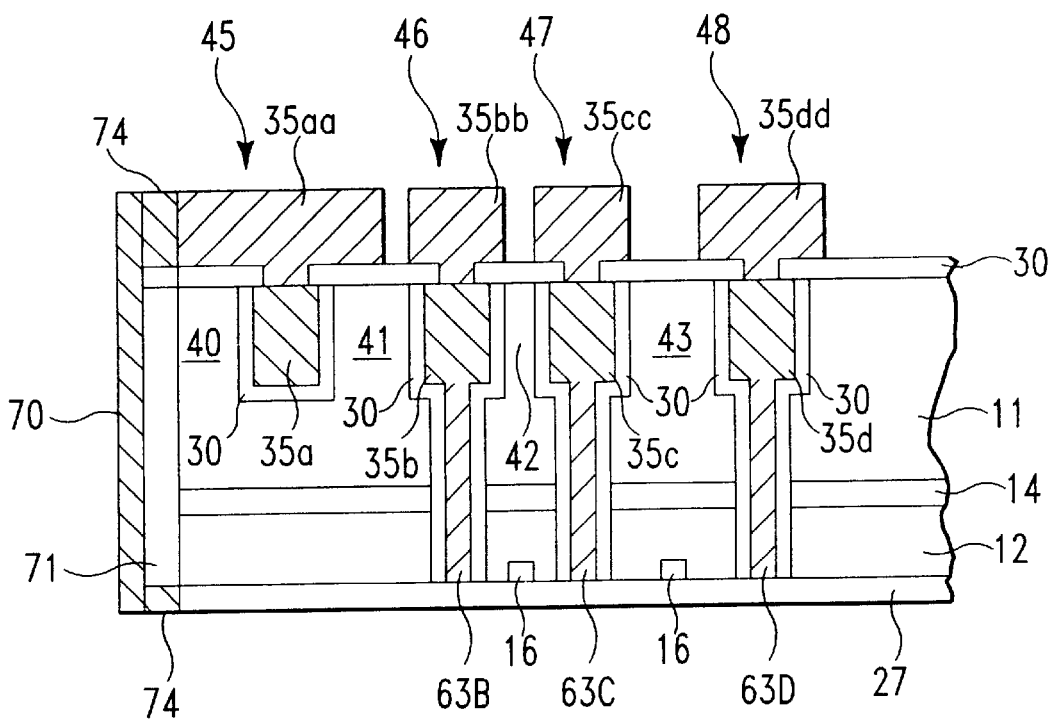
FIG. 6 is a cross-sectional schematic representation of a semiconductor chip of the invention having a plurality of heat sinking decoupling capacitors, in accordance with the present invention, formed thereon.

FIG. 6 is a cross-sectional schematic representation of a semiconductor chip similar to that shown in FIG. 3 having a plurality of decoupling capacitors, in accordance with the present invention, formed thereon.

Shown in this FIG. 6, the uppermost plate 35 is formed as a multiplicity of individual sites 35*a*, 35*b*, 35*c*, and 35*d*, each of which is separately coupled to those respective positions in the circuit or those devices requiring an individual decoupling capacitor and/or heat sink coupled thereto. Extended plates 35*bb* and 35*cc*, respectively overlying and coupled to sites 35*b* and 35*c*, are shown as being identical in size. The extended plates 35*aa* and 35*dd*, respectively overlying and coupled to sites 35*a* and 35*d*,are shown as being different in size. The plates 35*b*, 35*c* and 35*d* are connected to the wiring network 27 through respective vias 63*b*, 63*c* and 63*d*. The extended plate 35*aa* couples the site 35*a* to the wiring net 27 via the side connection 70.

Very precise decoupling and heat sinking of selected areas or devices in the chip circuit can be achieved by forming such a plurality of precisely sized metal deposits on the insulated back surface of the chip and selectively and individually connecting, through appropriate vias, these deposits to the circuits, on the front surface of the chip, needing the precise decoupling capacitance or heat sinking.

Although only two of the plates, 35*bb* and 35*cc*, are shown as identical in size, it should be understood that all the plates can be identical in size and capacitive value and/or heat sinking value or all may be different in size and capacitive value and/or heat sinking value.

Very precise decoupling and/or heat sinking of selected areas in the chip circuit can be achieved by forming such a plurality of precisely sized metal deposits on the insulated back surface of the chip and selectively and individually connecting, through appropriate vias, these deposits to the circuits, on the front surface of the chip, needing the precise decoupling capacitance and/or heat sinking values.

It must be noted that may variations and changes can be made in the present invention without departing from its spirit or scope. For example, the vias 63 can be backfilled with any conductive material such as the metals copper, silver, aluminum or with polysilicon, or conductive polymers, etc.

Again, it can be readily seen that because of the extended surface of the plates 35*bb* and 35*cc* the present invention provides a capacitor having not only greater capacitance than that of the prior art devices but also provides a significant heat sinking capacity than that was not available to prior art devices which depended on placing the decoupling capacitors on the active surface of the circuit. The formation of this extended surface in the plates 35*bb* and 35*cc* especially improves the heat sinking effect of the plates not only by creating additional surface area for convection cooling and also by providing channels through which air may be forced to enhance air cooling of the unit.

It should however be noted that in the present invention the available capacitance can be further extended by also combining the present invention with the prior art. That is, there is any reason as why a device built in accordance with the present invention cannot also incorporate the prior art decoupling capacitors on the face of the chip.

It should be noted that although the above embodiments of the present invention have been described as using well-known materials such as are commonly used in the art that it will be apparent, to those skilled in the semiconductor art. That other suitable materials can be substituted for the various parts of the invention.

It should be further noted that although the substrate has been described as being connected to ground that it could also be connected to a second voltage source such as a negative voltage source.

Thus, the invention teaches a significant and very effective decoupling capacitor and heat sink combination that, in a single structure provides both a heat sink and a decoupling capacitor in close proximity to the active circuit on the chip requiring either heat sinking or decoupling capacitance or both.

While the invention has been particularly described with respect to a preferred embodiment, it should be understood that one skilled in the art can, from the foregoing, readily make changes in form and detail without departing from the spirit and scope of the invention.

While the invention has been particularly described with respect to a preferred embodiment, it should be understood that one skilled in the art can, from the foregoing, readily make changes in form and detail without departing from the spirit and scope of the invention.

What is claimed is:

1. A process of forming a capacitor on a semiconductor device comprising the steps of:
    selecting a silicon on insulator semiconductor body formed of an epitaxial layer and a substrate layer separated by a buried oxide layer, said epitaxial layer forming a first major surface of said body and said substrate layer forming a second major surface of said body;
    forming an integrated circuit, comprised of a plurality of active and passive devices, in said epitaxial layer;
    forming a plurality of wiring levels on said first surface and overlying said integrated circuit;
    coupling selected ones of said wiring levels to selected ones of said active and passive devices;
    forming trenches in said second surface of said semiconductor body;
    forming a first insulating layer on said second surface of said semiconductor body;
    forming a layer of refractory material selected from the class consisting of tantalum, tantalum nitride tungsten and tungsten nitride on said first insulating layer;
    forming a conductive layer on said layer of refractory material;
    forming a second insulating layer on said conductive layer;
    forming conductive means between said a first one of said wiring levels and said substrate layer; and
    forming conductive means between a second one of said wiring levels and said conductive layer;
    whereby said conductive layer forms one plate of a capacitor with respect to said substrate which forms the second plate of said capacitor.

2. The process of claim 1 wherein said conductive means are formed by:
    reactively ion etching a first via through the epitaxial layer, the oxide layer 14 and into the substrate layer, said first via terminating in said substrate layer; and
    forming a second via through the epitaxial layer, the oxide layer 14, the substrate layer, the refractory coating and into the metal layer overlying said refractory coating, said second via terminating in said metal layer
    coating the walls of the vias are with a dielectric coating; and deposited a conductor in said vias.

3. The process of claim 1 wherein said dielectric coatings are formed from the class consisting of Silicon Dioxide ($SiO_2$), Polyamide and Silicon Nitride.

4. The process of claim 1 wherein said layer of refractory material on said first insulating layer is selected from the class consisting of tantalum, tantalum nitride tungsten and tungsten nitride.

5. A process of forming a castellated decoupling capacitor on a semiconductor comprising the steps of:
    selecting a semiconductor substrate having first and second major surfaces,
    depositing a silicon dioxide layer on said first surface;
    depositing a first layer of refractory material, approximately 50 Å, of tantalum nitride (TaN) on said silicon dioxide layer;
    depositing a layer of tantalum, less than 1000 Å in thickness, on said first layer of refractory material;
    depositing a layer of a conductive metal, greater than 20 microns, over said first layer of refractory material;
    reactively ion etching a plurality of grooves, each groove being separated from an adjacent groove by a fin in said layer of conductive metal;
    coating the surface of each of said grooves and each separating fin with a second layer layer of a refractory material;
    forming a dielectric layer, less than 1000 Å in thickness, in said plurality of grooves and over each separating fin;
    forming a second layer of a refractory material on said dielectric layer in said plurality of grooves and over each separating fin;
    forming a second deposit, 20 microns, of a conductive metal over said second layer of a refractory material;
    forming an integrated circuit, comprised of a plurality of active and passive devices, in said second surface;
    forming a plurality of wiring levels on said first surface over said plurality of active and passive devices;
    coupling said wiring levels to said active and passive devices in said integrated circuit;
    forming a dielectric layer on said second major surface of said substrate;
    depositing a first conductive material on said dielectric layer on said second major surface of said substrate;
    forming a first hole through said wiring levels and said first region into said second region;
    terminating said first hole in said second region;
    forming a second hole through said wiring levels, said first and second regions and said dielectric level on said second major surface to said first conductive material;
    forming a dielectric lining on the walls of said first and second holes;
    depositing a second conductive material on the dielectric lining in said first and second holes;
    said second conductive material on the dielectric lining in said first hole extending though said first hole to electrically connect a first selected wiring level on said integrated circuit to said second region, and said second conductive layer in said second hole extending though said second hole to electrically connect a second selected wiring level on said integrated circuit to contact said first conductive material deposited on said dielectric layer on said second major surface of said substrate to form a capacitor between said second region in said substrate and said first conductive material on said dielectric layer on said second major surface of said substrate.

6. A semiconductor device comprising:
    a semiconductor body having first and second major surfaces separated by a buried oxide layer that separates said body into first and second regions;
    said first region being a doped region extending from said first surface to said buried oxide layer;
    said second region extending from said buried oxide layer to said second surface;
    an integrated circuit, comprised of a plurality of active and passive devices, in said doped region;
    a plurality of wiring levels, disposed in said first region, having selected contact points thereon, each wiring level being coupled to respective ones of said active and passive devices;
    an insulator disposed on said second major surface; and
    a first metallic deposit on said first insulator on said second major surface;

an insulator disposed on said first metallic deposit; and a metallic deposit formed on said second insulator on said major surface;

a first opening having extended walls passing through said wiring levels and through said body to said second major surface;

a second opening having extended walls passing through said wiring levels, said doped region and said buried oxide layer into said remainder of said body;

said second opening terminating in said remainder of said body;

an insulator on the walls of said openings, metallic deposits in said first and second openings, the metallic deposit in said first opening extending from said a first of said wiring levels to said first metallic deposit on said first insulator on said second major surface and the metallic deposit in said second opening extending from said second of said wiring levels to said second metallic deposit on said second insulator on said second major surface.

7. A process of forming a capacitor with heat sinking capacity on a semiconductor substrate having first and second major surfaces comprising the steps of:

selecting a semiconductor substrate having first and second major surfaces and a buried oxide layer in said substrate substantially parallel to and between said first and second major surfaces to define first and second regions in said substrate;

forming a plurality of trenches in said second region;

forming an integrated circuit, comprised of a plurality of active and passive devices, in said first region;

forming a plurality of insulated wiring levels on said first surface, and coupling respective ones of said wiring levels to respective ones of said active and passive devices;

forming a first dielectric layer on said formed second major surface of said substrate;

depositing a first metallic layer on said first dielectric layer on said second major surface of said substrate;

forming a first via through said first region, said buried oxide layer, said second region and said first dielectric layer to said first metallic layer;

forming a second via through said first region, said buried oxide layer, and terminating said second via in said second region;

forming a dielectric lining on the walls of said first and second vias;

forming a first conductive path in said first via to electrically contact said second region and said first metallic layer to said integrated circuit and a second conductive path in said second via to respectively electrically contact said second region and said first metallic layer to said integrated circuit;

forming a second dielectric layer on said first conductive layer on second major surface of said substrate and said second dielectric lining extending down the wall of said second through hole, said second dielectric lining in said second through hole extending to said selected region of said integrated circuit; and depositing a second conductive layer on said second dielectric layer on said second major surface of said substrate and on said second dielectric lining in said second hole; said second conductive layer coating said second dielectric in said second hole being substantially coaxial with said wall of said second hole and extending though said second hole and electrically contacting said second selected region of said integrated circuit whereby said first and second conductive layers form a respective plate of a respective capacitor with respect to said substrate which is connected to ground and forms the second plate of each respective capacitor.

* * * * *